United States Patent
Hasegawa et al.

(10) Patent No.: US 9,330,936 B2
(45) Date of Patent: May 3, 2016

(54) METHOD FOR DEPOSITING METAL LAYERS ON GERMANIUM-CONTAINING FILMS USING METAL CHLORIDE PRECURSORS

(71) Applicant: Tokyo Electron Limited, Minato-ku, Tokyo (JP)

(72) Inventors: Toshio Hasegawa, Delmar, NY (US); Hideaki Yamasaki, Akasaka (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/534,496

(22) Filed: Nov. 6, 2014

(65) Prior Publication Data

US 2015/0132939 A1    May 14, 2015

Related U.S. Application Data

(60) Provisional application No. 61/902,190, filed on Nov. 9, 2013.

(51) Int. Cl.
| | |
|---|---|
| *H01L 21/3205* | (2006.01) |
| *H01L 21/02* | (2006.01) |
| *H01L 21/285* | (2006.01) |
| *H01L 29/66* | (2006.01) |

(52) U.S. Cl.
CPC ...... *H01L 21/32051* (2013.01); *H01L 21/0245* (2013.01); *H01L 21/02381* (2013.01); *H01L 21/02532* (2013.01); *H01L 21/28518* (2013.01); *H01L 21/28556* (2013.01); *H01L 29/66795* (2013.01)

(58) Field of Classification Search
CPC ................................................ H01L 21/28556
See application file for complete search history.

(56) References Cited

U.S. PATENT DOCUMENTS

| | | | |
|---|---|---|---|
| 5,975,912 | A | 11/1999 | Hillman et al. |
| 6,268,274 | B1 | 7/2001 | Wang et al. |
| 6,294,466 | B1 | 9/2001 | Chang |
| 7,393,563 | B2 | 7/2008 | Basceri et al. |
| 8,334,208 | B2 | 12/2012 | Narushima |
| 2012/0094453 | A1 | 4/2012 | Han et al. |
| 2013/0295759 | A1 | 11/2013 | Lu et al. |

OTHER PUBLICATIONS

International Searching Authority, International Search Report and Written Opinion issued in corresponding International Application No. PCT/US2014/064347, dated Feb. 17 2015, 10 pages.

*Primary Examiner* — Alexander Ghyka
(74) *Attorney, Agent, or Firm* — Wood, Herron & Evans, LLP

(57) ABSTRACT

A method is provided for forming a semiconductor device. According to one embodiment, the method includes providing a substrate having a Ge-containing film thereon, identifying a first plasma processing recipe that uses a metal chloride precursor to deposit a first metal layer on the Ge-containing film at a higher rate than the Ge-containing film is etched by the metal chloride precursor, identifying a second plasma processing recipe that uses the metal chloride precursor to etch the Ge-containing film at a higher rate than a second metal layer is deposited on the Ge-containing film by the metal chloride precursor, performing the first plasma processing recipe to deposit the first metal layer on the Ge-containing film, and performing the second plasma processing recipe to deposit the second metal layer on the first metal layer, and where the second metal layer is deposited at a higher rate than the first metal layer.

20 Claims, 7 Drawing Sheets

METHOD FOR DEPOSITING METAL LAYERS ON GERMANIUM-CONTAINING FILMS USING METAL CHLORIDE PRECURSORS

CROSS-REFERENCE TO RELATED APPLICATIONS

This application is related to and claims priority to U.S. Provisional application Ser. No. 61/902,190 (Ref no. TTCA-452PRO) filed on Nov. 9, 2013, the entire contents of which are herein incorporated by reference.

FIELD OF THE INVENTION

The present invention generally relates to forming metal layers on semiconductor substrates using vapor deposition, and more particularly to depositing metal layers on germanium-containing films using metal chloride precursors.

BACKGROUND OF THE INVENTION

In the semiconductor industry, new 3D devices such as FinFETs are entering manufacturing of semiconductor devices. FinFETs require conformal contact layers, such as titanium silicide wrap around layers, which are favorable from ground-rule, design, and cost perspective.

Further, the minimum feature sizes of microelectronic devices are approaching the deep sub-micron regime to meet the demand for higher, lower power microprocessors and digital circuits. Low resistivity refractory metal silicide layers, for instance, are widely used as part of the gate stack in dynamic random access memory (DRAM) and enhanced DRAM (EDRAM) manufacturing. Another application for low resistivity metal silicide layers is in the capacitor of deep trench-DRAM or in vias of stacked DRAM cells. Both applications suffer from the fact that the serial resistance of the inner electrode (plug, deep trench-DRAM) or vias (stacked DRAM) increases with the square of the inverse ground rule. This effect is further enhanced since the requirement of constant capacitance leads to deeper trenches (or higher stacks, respectively) in advanced DRAMs.

A key requirement for deep trench—DRAM is good step coverage of metal silicide layers in trenches with high aspect ratios. Additional requirements include that the metal silicide layers must have low electrical resistivity and must be stable at conventional processing temperatures used in manufacturing integrated circuits. Conformal deposition of these layers is usually required and this is very challenging for very deep trenches.

SUMMARY OF THE INVENTION

Embodiments of the invention describe methods for depositing metal layers on germanium (Ge)-containing films using metal chloride precursors. The metal layers can, for example, be deposited on raised features on a substrate and in recessed features in a substrate. The metal layers can, for example, contain titanium, molybdenum, tungsten, tantalum, vanadium, or a combination of two or more thereof. Embodiments of the invention address detrimental degradation and etching of the Ge-containing films during exposure to metal chloride precursors used to deposit metal layers on the Ge-containing films.

According to one embodiment, the method includes providing a substrate having a Ge-containing film thereon, identifying a first plasma processing recipe that uses a metal chloride precursor to deposit a first metal layer on the Ge-containing film at a higher rate than the Ge-containing film is etched by the metal chloride precursor, and identifying a second plasma processing recipe that uses the metal chloride precursor to etch the Ge-containing film at a higher rate than a second metal layer is deposited on the Ge-containing film by the metal chloride precursor. The method further includes performing the first plasma processing recipe to deposit the first metal layer on the Ge-containing film, and performing the second plasma processing recipe to deposit the second metal layer on the first metal layer, where the second metal layer is deposited at a higher rate than the first metal layer.

According to another embodiment, the method includes providing a substrate having a Ge-containing film thereon, wherein the Ge-containing film is a silicon-germanium film or a germanium film, identifying a first plasma processing recipe that uses $TiCl_4$ to deposit a first Ti layer on the Ge-containing film at a higher rate than the Ge-containing film is etched by the $TiCl_4$, and identifying a second plasma processing recipe that uses $TiCl_4$ to etch the Ge-containing film at a higher rate than a second Ti layer is deposited on the Ge-containing film by the $TiCl_4$ precursor. The method further includes performing the first plasma processing recipe to deposit the first Ti layer on the Ge-containing film, and performing the second plasma processing recipe to deposit the second Ti layer on the first Ti layer, where the second Ti layer is deposited at a higher rate than the first Ti layer.

According to yet another embodiment, the method includes providing a substrate having a Ge-containing film thereon, depositing a Si film on the Ge-containing film, and exposing the Si film to a plasma excited metal chloride precursor to deposit a metal layer on the Si film.

DETAILED DESCRIPTION OF SEVERAL EMBODIMENTS

Figure 1A:
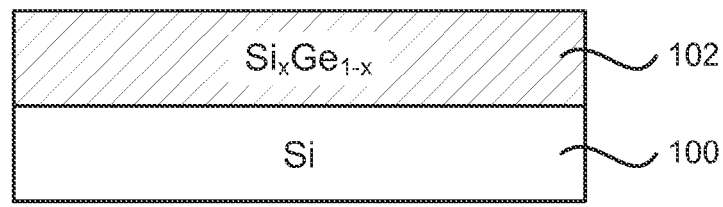
FIGS. 1A-1C show schematic cross-sectional views of a process flow for forming a metal layer on a Ge-containing film according to an embodiment of the invention.

Methods for forming metal layers on Ge-containing films using metal chloride precursors are disclosed in several embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. In this detailed description, like parts are designated by like reference numbers throughout the several drawings.

In the semiconductor industry, Ge-containing films have received considerable interest in device manufacturing, for example when integrated into 3D devices such as FinFETs. FinFETs require formation of wrap around conformal contact layers, such as titanium silicide. Titanium silicide layers can be formed by chemical vapor deposition (CVD) or atomic layer deposition (ALD) by depositing Ti metal onto a substrate using a gaseous titanium chloride precursor in a plasma environment, for example plasma excited $TiCl_4$. Thereafter, the substrate may be heat-treated to form titanium silicide. However, Ge-containing films react with plasma excited $TiCl_4$ to form volatile $GeCl_x$ byproducts (e.g., $GeCl_4$), thereby etching the Ge-containing films. Embodiments of the invention address these problems and provide methods for forming metal layers with high deposition rates on Ge-containing films.

Figure 5A:
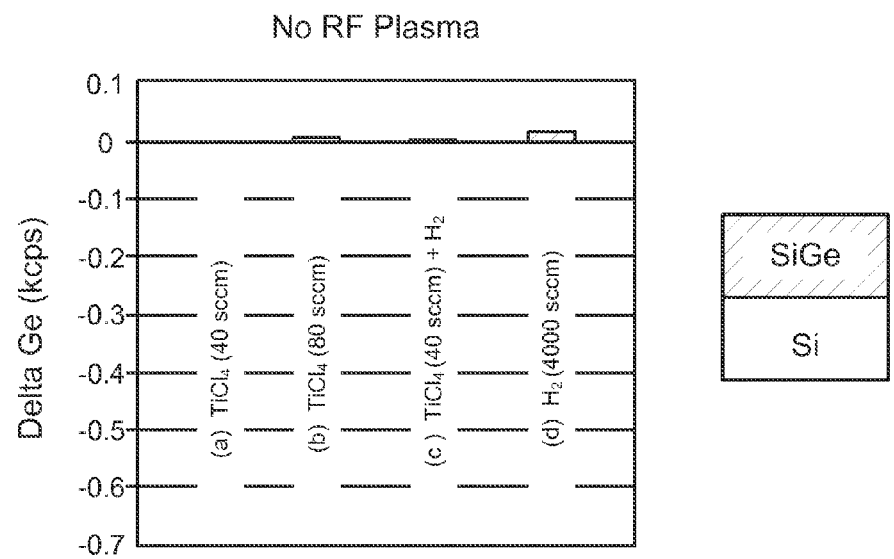
FIGS. 5A-5B show effect of different process gases on etching of a SiGe substrate.

FIGS. 5A-5B and 6A-6B show the effect of different process gases on etching of SiGe films. The process gases included $TiCl_4$, Ar, and $H_2$, both alone and in combination. The test samples contained a 45 nm thick $Si_{0.6}Ge_{0.4}$ (hereinafter SiGe) film on a Si substrate. In FIG. 5A, the process gases were exposed to the SiGe film for 5 minutes at 450° C. without the use of RF plasma excitation and the SiGe film thickness was measured by XRF before and after the gas exposures. The process conditions were: (a) $TiCl_4$ (40 sccm), (b) $TiCl_4$ (80 sccm), (c) $TiCl_4$ (40 sccm)+$H_2$ gas, and (d) $H_2$ (4000 sccm). The results in FIG. 5A show that the gas exposures in (a)-(d) had little effect on the $Si_{0.6}Ge_{0.4}$ film thickness.

Figure 5B:
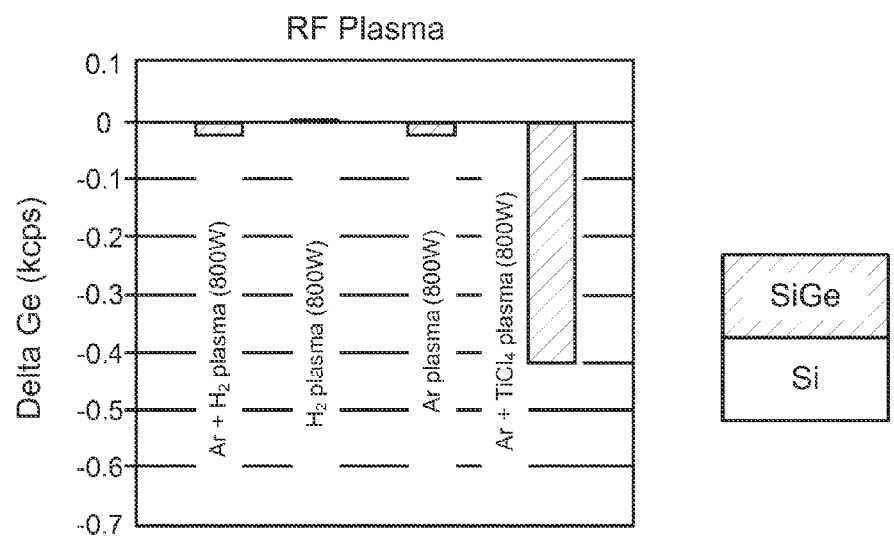

In FIG. 5B, the process gases were exposed to the SiGe film for 3 minutes at 450° C. using RF plasma excitation in a capacitively coupled plasma (CCP) processing system and the SiGe film thickness was measured by XRF before and after the gas exposures. The process conditions were: (a) Ar+$H_2$ plasma (800 W), (b) $H_2$ plasma (800 W), (c) Ar plasma (800 W), and (d) Ar+$TiCl_4$ (800 W). The results in FIG. 5B show that only the gas exposure in (d) significantly etched the SiGe film, and reduced the SiGe film thickness by about 50%.

Figure 6A:
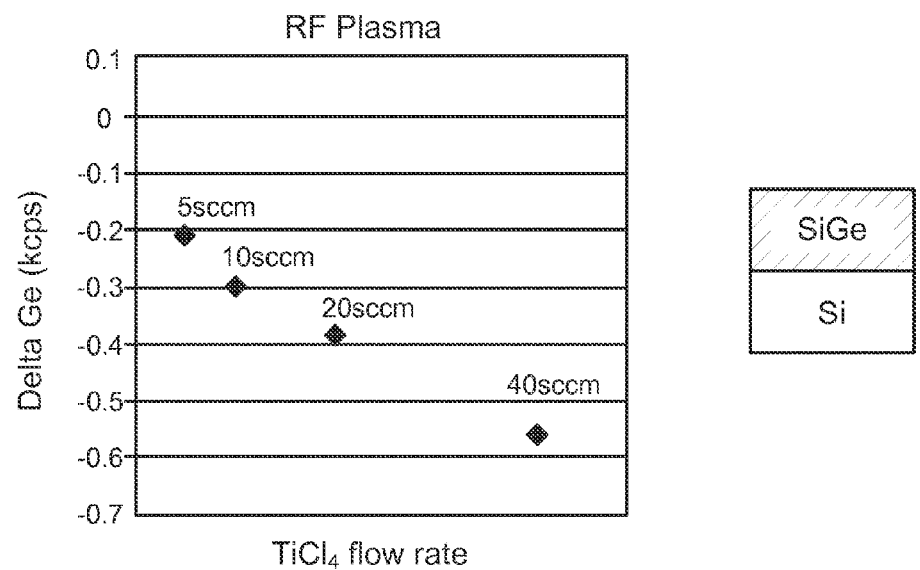
FIGS. 6A-6B show effect of different $TiCl_4$ gas flows and RF plasma powers on etching of a SiGe substrate.
Figure 6B:
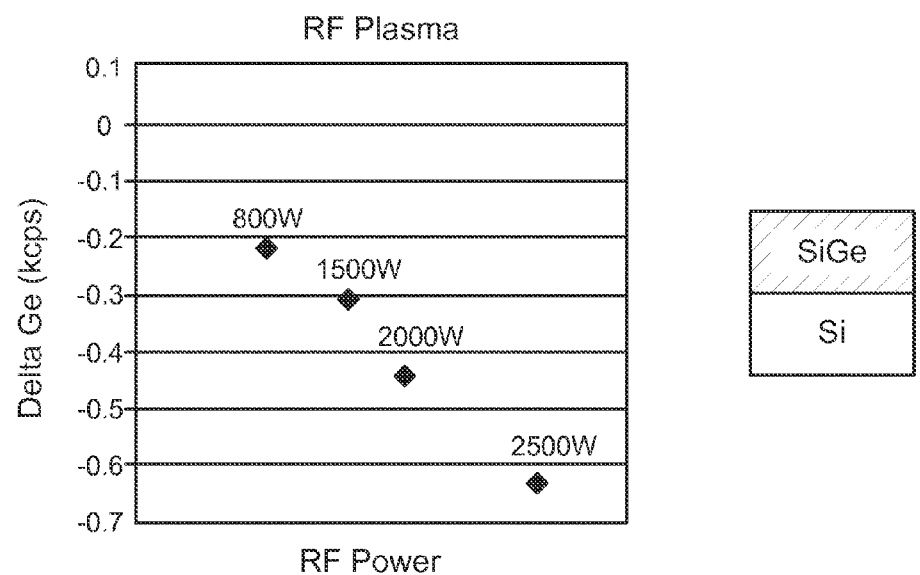

In FIG. 6A, process gas contained plasma excited $TiCl_4$. The results show that the etching of the SiGe film increased as the $TiCl_4$ gas flow rate was increased from 5 to 40 sccm. The RF plasma power was 400 W. In FIG. 6B, the results show that the etching of the SiGe film increased as the RF plasma power was increased from 800-2500 W. The $TiCl_4$ gas flow rate was 40 sccm. The results in FIGS. 6A-6B show that increased $TiCl_4$ gas flow and increased RF plasma power both increased the etching of the SiGe film.

The results in FIGS. 5B and 6A-6B show that a plasma processing recipe using high $TiCl_4$ gas flows and/or high RF plasma power etches a SiGe film very effectively, instead of depositing Ti on the SiGe film. Therefore, under these conditions the SiGe film is etched a higher rate than a Ti layer is deposited on the SiGe film.

Embodiments of the invention address the problem of SiGe film etching when a SiGe film is exposed to a plasma excited metal chloride precursor. A first deposition step deposits a thin first metal layer on the SiGe film while minimizing etching of the SiGe film and, thereafter, a second deposition step deposits a thick second metal layer on the thin first metal layer. Further, the second metal layer is deposited at a higher rate than the first metal layer. This provides an overall deposition rate that is high enough for high throughput device manufacturing, while minimizing etching of the SiGe film.

The following examples describe deposition of Ti on a SiGe film using plasma excited $TiCl_4$ gas, but embodiments of the invention may be applied to many other metal chloride precursors. In one embodiment, the metal chloride precursor may be selected from the group consisting of titanium chloride, molybdenum chloride, tungsten chloride, tantalum chloride, and vanadium chloride. In one embodiment, the metal chloride precursor may be selected from the group consisting of $TiCl_4$, $MoCl_4$, $WCl_6$, $TaCl_5$, and $VCl_4$. The metal layer can include titanium (Ti), molybdenum (Mo), tungsten (W), tantalum (Ta), or vanadium (V), or a combination thereof.

Figure 1B:
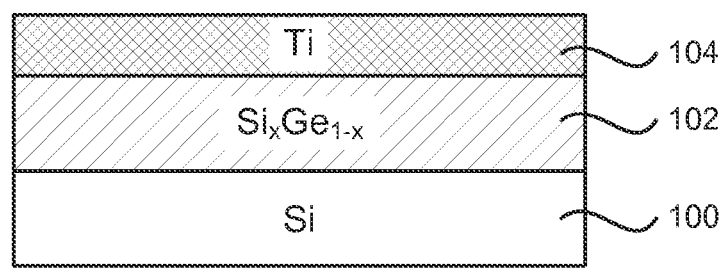
Figure 1C:
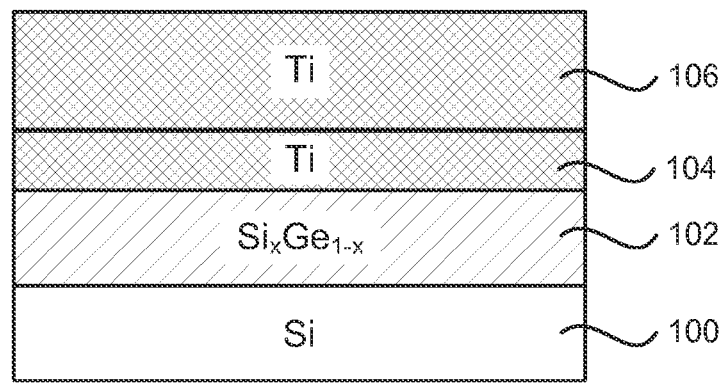

FIGS. 1A-1C show schematic cross-sectional views of a process flow for forming a metal layer on a Ge-containing film according to an embodiment of the invention. FIG. 1A shows a $Si_xGe_{1-x}$ film 102 on a Si substrate 100. In some embodiments, the Si substrate 100 may be a patterned substrate containing recessed features or raised features. The recessed features can, for example, include trenches, vias, or a combination thereof, that are commonly found in semiconductor devices. The raised features can, for example, include fins and more complex 3D structures. The substrate 100 may be a Si substrate of any size, for example a 200 mm substrate, a 300 mm substrate, a 450 mm substrate, or an even larger substrate. In the $Si_xGe_{1-x}$ film 102, x is the atomic fraction of Si, 1-x is the atomic fraction of Ge, and $0 \leq x < 1$. In one example, x=0 for a Ge film 102.

According to an embodiment of the invention, the method includes identifying a first plasma processing recipe that uses $TiCl_4$ to deposit the first Ti layer on the $Si_xGe_{1-x}$ film 102 at a higher rate than the $Si_xGe_{1-x}$ film 102 is etched by the $TiCl_4$, and identifying a second plasma processing recipe that uses $TiCl_4$ to etch the $Si_xGe_{1-x}$ film 102 at a higher rate than a second Ti layer is deposited on the $Si_xGe_{1-x}$ film 102. The first and second plasma processing recipes may, for example, be identified by varying the $TiCl_4$ flow rate, the RF plasma power, or both the $TiCl_4$ flow rate and the RF plasma power. According to one embodiment of the invention, the second plasma processing recipe has a higher $TiCl_4$ flow rate than the first plasma processing recipe. According to one embodiment of the invention, the second plasma processing recipe has a higher RF plasma power than the first plasma processing recipe. According to one embodiment of the invention, the second plasma processing recipe has a higher $TiCl_4$ flow and a higher RF plasma power than the first plasma processing recipe.

According to one embodiment, the first plasma processing recipe includes a CVD process that uses a process gas containing $TiCl_4$ and $H_2$. According to another embodiment, the first plasma processing recipe includes an ALD process that uses alternate exposures of $TiCl_4$ and $H_2$. In the CVD and the ALD processes, the $TiCl_4$ flow rate in the first plasma processing recipe can be between 2 sccm and 20 sccm and the RF plasma power can be between about 100 W and about 400 W.

The substrate temperature for the ALD and CVD processes can be between about 400° C. and about 700° C.

According to one embodiment, the second plasma processing recipe includes a CVD process that uses a process gas containing $TiCl_4$ and $H_2$. According to another embodiment, the second plasma processing recipe includes an ALD process that uses alternate exposures of $TiCl_4$ and $H_2$. In the CVD and the ALD processes, the $TiCl_4$ flow rate in the second plasma processing recipe can be greater than 20 sccm, for example between greater than 20 sccm and 200 sccm. The RF plasma power can be greater than 400 W, for example between greater than 400 W and 3000 W. The substrate temperature for the ALD and CVD processes can be between 400° C. and 700° C.

The method includes performing the first plasma processing recipe to deposit the first Ti layer 104 on the $Si_xGe_{1-x}$ film 102. This is shown in FIG. 1B. The first plasma processing recipe forms a first Ti layer 104 that has good adhesion to the $Si_xGe_{1-x}$ film 102. A thickness of the first Ti layer 104 can, for example, be between about 1 nm and about 5 nm.

Thereafter, the method includes performing the second plasma processing recipe to deposit a second Ti layer 106 on the first Ti layer 104, where the second Ti layer 106 is deposited at a higher rate than the first Ti layer 104. FIG. 1C shows the second Ti layer 106 deposited on the first Ti layer 104. A thickness of the second Ti layer 106 can, for example, be between about 3 nm and about 15 nm. According to embodiments of the invention, the first Ti layer 104 protects the $Si_xGe_{1-x}$ film 102 from etching during exposure to $TiCl_4$ when the second plasma processing recipe is performed, thereby allowing for depositing the second Ti layer 106 with a high deposition rate without etching the $Si_xGe_{1-x}$ film 102.

The deposition method described in FIGS. 1A-1C may be applied to raised features on a substrate. FIG. 2A-2D show schematic cross-sectional views of a process flow for forming a metal layer on a Ge-containing film according to an embodiment of the invention. The silicon-on-insulator (SOI) structure in FIG. 2A includes a substrate 200, an insulator 203 (e.g., $SiO_2$), and a Si fin 201. FIG. 2B shows a $Si_xGe_{1-x}$ film 202 selectively deposited on the Si fin 201, FIG. 2C shows a first Ti layer 204 deposited on the $Si_xGe_{1-x}$ film 202, and FIG. 2D shows a second Ti layer 206 deposited on the first Ti layer 204. The first Ti layer 204 and the second Ti layer 206 form a wrap around conformal contact layer for the fin $Si_xGe_{1-x}$ film 202.

Figure 2A:
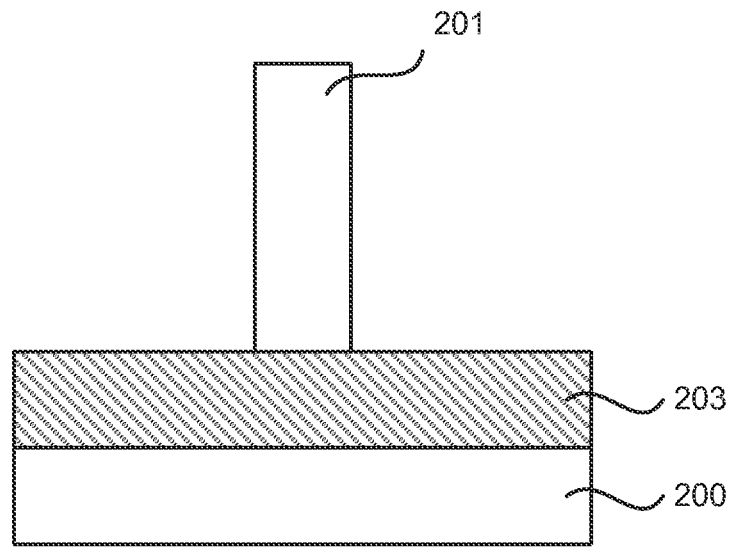
FIG. 2A-2D show schematic cross-sectional views of a process flow for forming a metal layer on a Ge-containing film according to another embodiment of the invention.
Figure 2B:
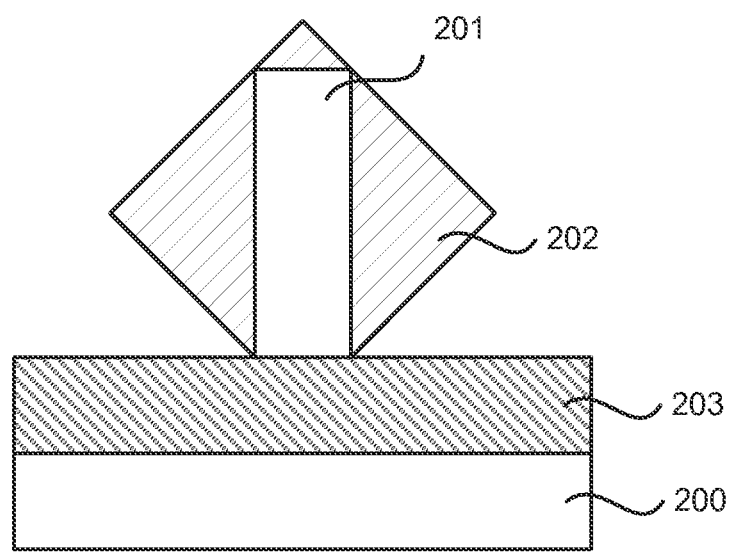
Figure 2C:
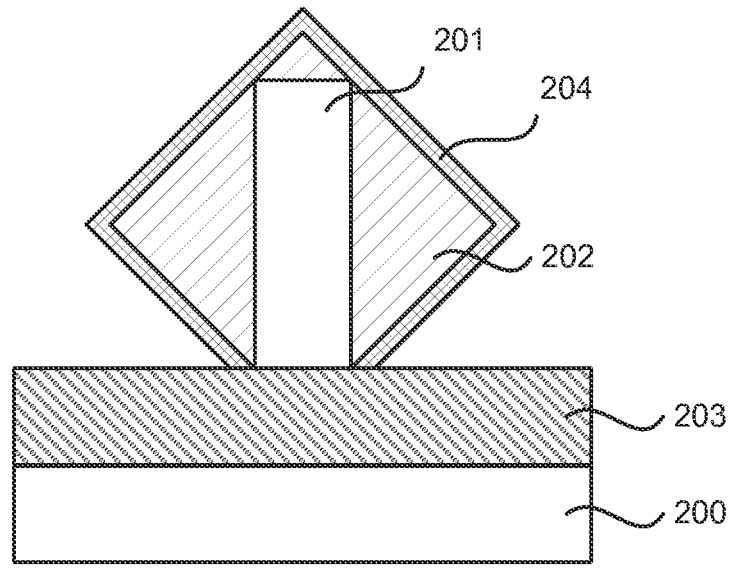
Figure 2D:
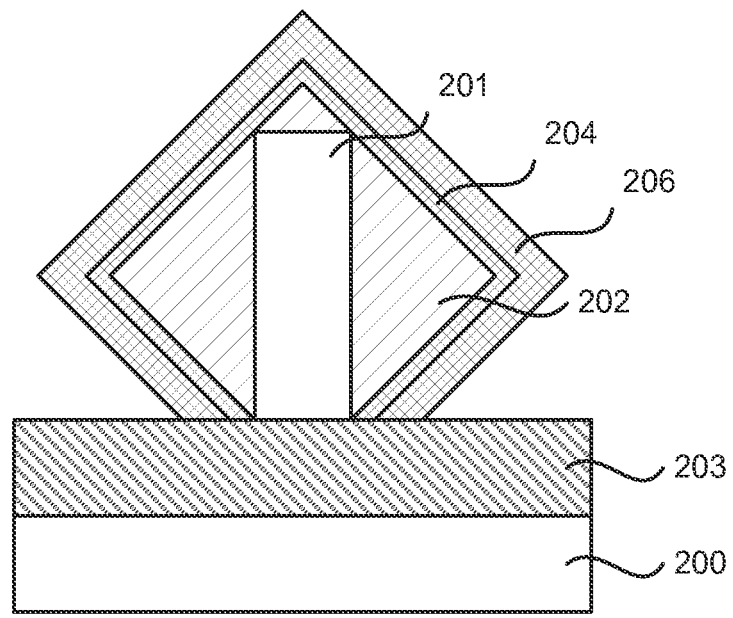

According to another embodiment, the structure shown in FIG. 2A may be replaced by a fin structure containing a bulk Si fin that extends through the insulator 203. In one example, the Ti layers 204 and 206 may be a PMOS contact.

Figure 3A:
FIGS. 3A-3C show schematic cross-sectional views of a process flow for forming a metal layer on a germanium-containing film according to still another embodiment of the invention.
Figure 3B:
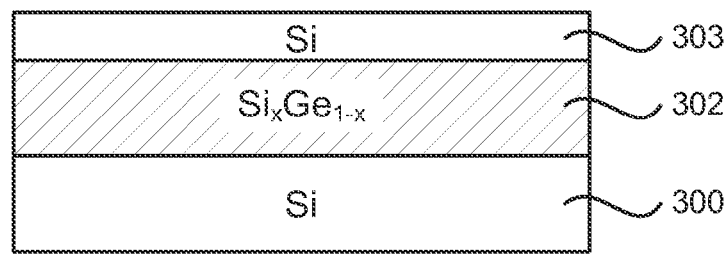
Figure 3C:
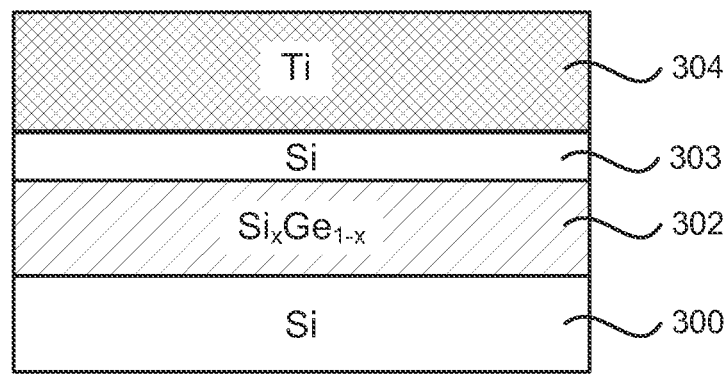

FIGS. 3A-3C show schematic cross-sectional views of a process flow for forming a metal layer on a Ge-containing film according to an embodiment of the invention. FIG. 3A shows a $Si_xGe_{1-x}$ film 302 on a substrate 300. In some embodiments, the substrate 300 may be a patterned substrate containing recessed features or raised features. The recessed features can, for example, include trenches, vias, or a combination thereof, that are commonly found in semiconductor devices. The raised features can, for example, include fins and more complex 3D structures. The substrate 300 may be a Si substrate of any size, for example a 200 mm substrate, a 300 mm substrate, a 450 mm substrate, or an even larger substrate. In the $Si_xGe_{1-x}$ film 102, x is the atomic fraction of Si, 1−x is the atomic fraction of Ge, and $0 \leq x < 1$. In one example, x=0 for a Ge film 302.

FIG. 3B shows a Si film 303 deposited on the $Si_xGe_{1-x}$ film 102. The Si film 303 may be an epitaxial Si film, a polycrystalline Si film, or an amorphous Si film. The Si film 303 may be deposited in a CVD process by exposing the $Si_xGe_{1-x}$ film 302 to a process gas containing a silicon-containing gas, for example $SiH_4$ or $Si_2H_6$. A thickness of the Si film 303 can, for example, be between about 0.5 nm and about 3 nm.

FIG. 3C shows a Ti layer 304 deposited on the Si film 303. The Ti layer 304 may be deposited using the first or second plasma processing recipes described in reference to FIGS. 1A-1D. The Si film 303 protects the $Si_xGe_{1-x}$ film 302 against etching during exposure to plasma excited $TiCl_4$. A thickness of the Ti layer 304 can, for example, be between about 5 nm and about 15 nm.

Figure 4:
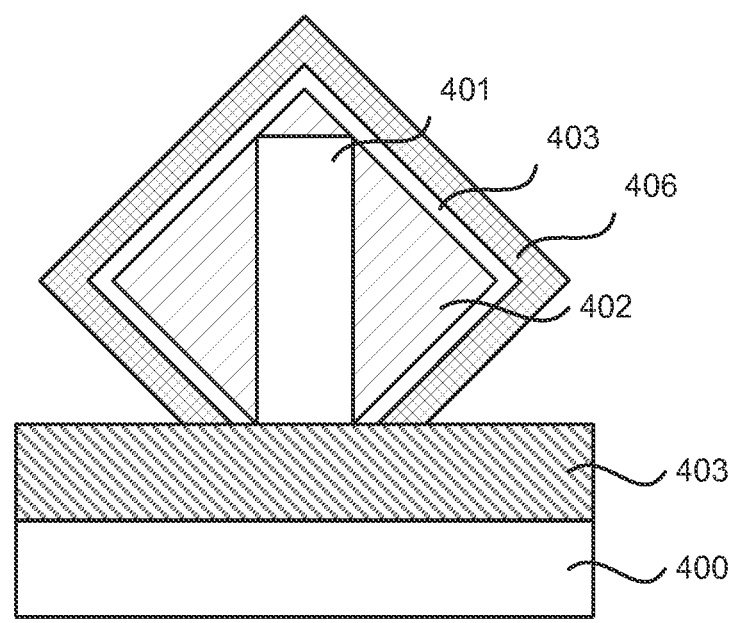
FIG. 4 shows a schematic cross-sectional view of a metal layer formed on a Ge-containing film according to an embodiment of the invention.

FIG. 4 shows a schematic cross-sectional view of a metal layer formed on a Ge-containing film according to an embodiment of the invention. The deposition method described in FIGS. 3A-3D may be applied to raised features on a substrate. The silicon-on-insulator (SOI) structure in FIG. 4 includes a substrate 400, an insulator 403 (e.g., $SiO_2$), and a Si fin 401. FIG. 4 shows a $Si_xGe_{1-x}$ film 402 deposited on the Si fin 201, a Si film 403 deposited on the $Si_xGe_{1-x}$ film 402, and a Ti layer 406 deposited on Si film 403.

According to another embodiment, the structure shown in FIG. 4 may be replaced by a fin structure containing a bulk Si fin that extends through the insulator 403. In one example, the Ti layer 406 may be a PMOS contact.

A plurality of embodiments for depositing metal layers on Ge-containing films using metal chloride precursors have been described. The foregoing description of the embodiments of the invention has been presented for the purposes of illustration and description. It is not intended to be exhaustive or to limit the invention to the precise forms disclosed.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, the method comprising:
    providing a substrate having a germanium (Ge)-containing film thereon, wherein the substrate includes a Si fin and the Ge-containing film is formed on surfaces of the Si fin;
    identifying a first plasma processing recipe that uses a metal chloride precursor to deposit a first metal layer on the Ge-containing film at a higher rate than the Ge-containing film is etched by the metal chloride precursor;
    identifying a second plasma processing recipe that uses the metal chloride precursor to etch the Ge-containing film at a higher rate than a second metal layer is deposited on the Ge-containing film by the metal chloride precursor;
    performing the first plasma processing recipe to deposit the first metal layer on the Ge-containing film; and
    performing the second plasma processing recipe to deposit the second metal layer on the first metal layer, wherein the second metal layer is deposited at a higher rate than the first metal layer.

2. The method of claim 1, wherein the Ge-containing film is a silicon-germanium film or a germanium film.

3. The method of claim 1, wherein the metal chloride precursor is selected from the group consisting of a titanium chloride, a molybdenum chloride, a tungsten chloride, a tantalum chloride, and a vanadium chloride.

4. The method of claim 1, wherein the metal chloride precursor is selected from the group consisting of $TiCl_4$, $MoCl_4$, $WCl_6$, $TaCl_5$, and $VCl_4$.

5. The method of claim 1, wherein the metal layer includes titanium (Ti), molybdenum (Mo), tungsten (W), tantalum (Ta), or vanadium (V), or a combination thereof.

6. The method of claim 1, wherein the second plasma processing recipe has a higher metal chloride gas flow rate than the first plasma processing recipe.

7. The method of claim 1, wherein the second plasma processing recipe has a higher RF plasma power than the first plasma processing recipe.

8. The method of claim 1, wherein the second plasma processing recipe uses a higher metal chloride gas flow rate and a higher RF plasma power than the first plasma processing recipe.

9. A method for forming a semiconductor device, the method comprising:
provided a substrate having a germanium (Ge)-containing film thereon, wherein the Ge-containing film is a silicon-germanium film or a germanium film, wherein the substrate includes a Si fin and the Ge-containing film is formed on surfaces of the Si fin;
identifying a first plasma processing recipe that uses $TiCl_4$ to deposit a first Ti layer on the Ge-containing film at a higher rate than the Ge-containing film is etched by the $TiCl_4$;
identifying a second plasma processing recipe that uses $TiCl_4$ to etch the Ge-containing film at a higher rate than a second Ti layer is deposited on the Ge-containing film by the $TiCl_4$;
performing the first plasma processing recipe to deposit the first Ti layer on the Ge-containing film; and
performing the second plasma processing recipe to deposit the second Ti layer on the first Ti layer, wherein the second Ti layer is deposited at a higher rate than the first Ti layer.

10. The method of claim 9, wherein the second plasma processing recipe has a higher $TiCl_4$ gas flow rate that the first plasma processing recipe.

11. The method of claim 10, wherein the $TiCl_4$ gas flow rate in the first plasma processing recipe is between 2 sccm and 20 sccm, and wherein the $TiCl_4$ gas flow rate in the second plasma processing recipe is greater than 20 sccm.

12. The method of claim 9, wherein the second plasma processing recipe has a higher RF plasma power than the first plasma processing recipe.

13. The method of claim 12, wherein the first plasma processing recipe has a RF plasma power between 100 W and 400 W, and wherein the second plasma processing recipe has a RF plasma power greater than 400 W.

14. The method of claim 9, wherein the second plasma processing recipe uses a higher $TiCl_4$ gas flow rate and a higher RF plasma power than the first plasma processing recipe.

15. A method for forming a semiconductor device, the method comprising:
providing a substrate having a germanium (Ge)-containing film thereon;
identifying a first plasma processing recipe using a metal chloride precursor that deposits the metal on the Ge-containing film at a higher rate than the Ge-containing film is etched by the metal chloride precursor;
identifying a second plasma processing recipe using the metal chloride precursor that etches the Ge-containing film at a higher rate than the metal is deposited on the Ge-containing film by the metal chloride precursor;
performing the first plasma processing recipe to deposit a first layer of the metal on the Ge-containing film to a first thickness and at a first rate; and
performing the second plasma processing recipe to deposit a second layer of the metal on the first layer of the metal to a second thickness greater than the first thickness and at a second rate greater than the first rate, wherein the first layer of the metal protects the Ge-containing film from etching by the metal chloride precursor during the performing of the second plasma processing recipe.

16. The method of claim 15, wherein the metal chloride precursor is selected from the group consisting of $TiCl_4$, $MoCl_4$, $WCl_6$, $TaCl_5$, and $VCl_4$.

17. The method of claim 15, wherein the second plasma processing recipe has a higher metal chloride gas flow rate than the first plasma processing recipe.

18. The method of claim 15, wherein the second plasma processing recipe has a higher RF plasma power than the first plasma processing recipe.

19. The method of claim 15, wherein the second plasma processing recipe uses a higher metal chloride gas flow rate and a higher RF plasma power than the first plasma processing recipe.

20. The method of claim 15, wherein the metal chloride precursor is $TiCl_4$, wherein the $TiCl_4$ gas flow rate in the first plasma processing recipe is between 2 sccm and 20 sccm and the $TiCl_4$ gas flow rate in the second plasma processing recipe is greater than 20 sccm, and wherein the first plasma processing recipe has a RF plasma power between 100 W and 400 W and the second plasma processing recipe has a RF plasma power greater than 400 W.

* * * * *